(12) United States Patent
Cao et al.

(10) Patent No.: US 7,579,650 B2
(45) Date of Patent: Aug. 25, 2009

(54) TERMINATION DESIGN FOR DEEP SOURCE ELECTRODE MOSFET

(75) Inventors: Jianjun Cao, Torrance, CA (US);
 Timothy Henson, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/890,849

(22) Filed: Aug. 8, 2007

(65) Prior Publication Data

US 2008/0035993 A1 Feb. 14, 2008

Related U.S. Application Data

(60) Provisional application No. 60/836,639, filed on Aug. 9, 2006.

(51) Int. Cl.
 *H01L 29/78* (2006.01)

(52) U.S. Cl. .............................. 257/333; 257/E29.257; 257/E21.418; 438/270; 438/268

(58) Field of Classification Search ................. 257/333, 257/E29.257, E21.418; 438/268, 270
 See application file for complete search history.

(56) References Cited

U.S. PATENT DOCUMENTS

| 6,838,735 B1 | 1/2005 | Kinzer et al. |
| 2006/0030142 A1 | 2/2006 | Grebs et al. |
| 2006/0060916 A1 | 3/2006 | Girdhar et al. |

OTHER PUBLICATIONS

International Search Report dated Feb. 13, 2008 issued in PCT Application No. PCT/US07/17744.

*Primary Examiner*—Kiesha L Rose
*Assistant Examiner*—Tucker Wright
(74) *Attorney, Agent, or Firm*—Farjami & Farjami LLP

(57) ABSTRACT

A power semiconductor device that includes a plurality of source trenches that extend to a depth below the gate electrodes and a termination region that includes a termination trench that is as deep as the source trenches.

6 Claims, 5 Drawing Sheets

TERMINATION DESIGN FOR DEEP SOURCE ELECTRODE MOSFET

RELATED APPLICATION

This application is based on and claims priority to the of U.S. Provisional Application Ser. No. 60/836,639, filed on Aug. 9, 2006, entitled Termination Design for Deep Source Electrode MOSFET, to which a claim of priority is hereby made and the disclosure of which is incorporated by reference.

BACKGROUND OF THE INVENTION

US Patent Publication No. 2006/0033154, assigned to the assignee of the present application and incorporated by reference, discloses a semiconductor power device having deep source electrodes which can be suitable for a power MOSFET with up to a 300V rating and a lower resistivity drift region. For example, a conventional 100V device may use 1.75 ohm-cm drift region while a device employing deep source electrodes may have a 0.25 ohm-cm drift region.

Conventional MOSFET designs may use a termination structure composed of diffused guard rings to reduce the electric field curvature, but still rely on the drift region to block a significant amount of voltage. If a conventional termination were used on a 100V MOSFET designed with a deep source electrode, the termination would only support about 30V due to the low-resistivity drift region.

Thus, a new termination that is capable of blocking a voltage equal or greater than the active cells of a deep source electrode MOSFET is desired. It is also desired to have a simple process to form the termination when fabricating a deep source electrode MOSFET.

SUMMARY OF THE INVENTION

A device, e.g. a MOSFET, that includes deep source electrodes is able to block a high reverse voltage with a low-resistivity drift region because the deep source electrodes create a horizontal electric field that depletes the drift region and enable the creation of a uniform electric field.

According to one aspect of the present invention, the portion of the termination closest to the last active cell is identical to the active cell (except that it does not include a source region) in order to avoid disturbing the depletion effect.

According to another aspect of the present invention, the termination region of the device includes an insulated field plate spaced above the surface of the semiconductor by an insulating material in order to avoid high electric field points outside the active region of the device.

According to yet another aspect of the present invention, the termination region includes an EQR trench and a drain contact at the end of the termination in order to block any leakage that may occur near the semiconductor surface, and to ensure a constant drain voltage on the top edge of the device.

A termination according to the present invention allows a device using deep source electrodes to be terminated using a minimum lateral width. Moreover, a termination according to the present invention mimics the active area features, to avoid adding any process complexity.

Simulations have shown that, when using a termination according to the present invention, the highest electric field occurs in the region between the termination and the active region, and that there are no high field points elsewhere in the termination, which can allow for a short field plate. Thus, unlike conventional guard ring and field plate terminations, the field plate is not relied on to smooth out junction curvature in that all of the high field is contained between the last active cell trench and the termination trench.

Other features and advantages of the present invention will become apparent from the following description of the invention which refers to the accompanying drawings.

DETAILED DESCRIPTION OF EMBODIMENTS OF THE INVENTION

Figure 1:
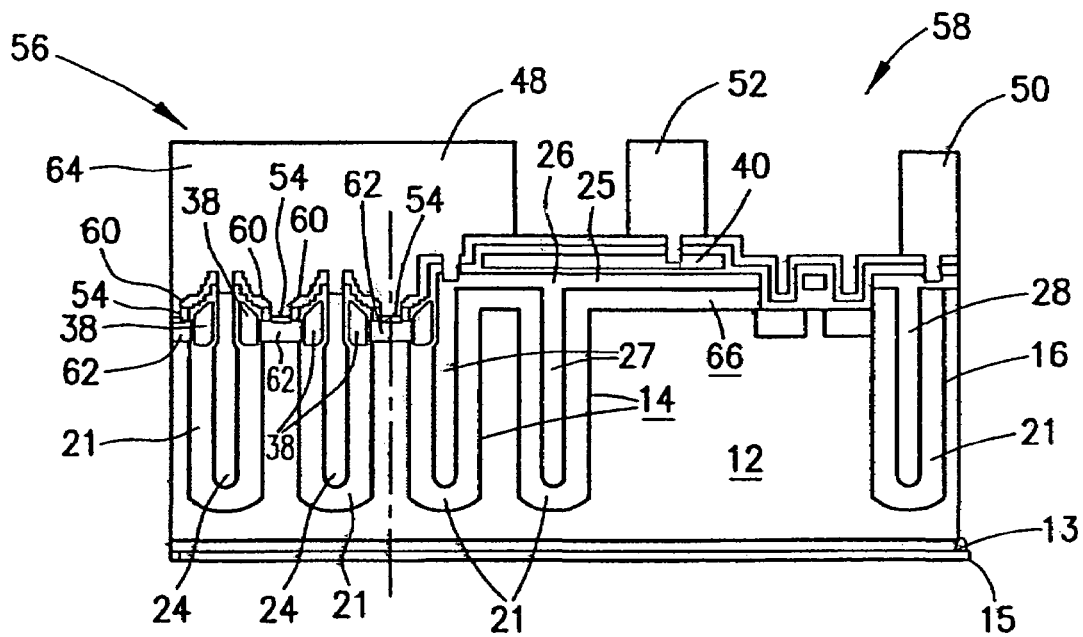
FIG. 1 illustrates a cross-sectional view of a termination region according to one embodiment of the present invention.

Referring to FIG. 1, a semiconductor device according to one embodiment of the present invention is preferably a power MOSFET that includes, an active region 56, and termination region 58, which surrounds active region 56. Active region 56, which in the preferred embodiment is the same active region disclosed in US 2006/00331514, includes a plurality of spaced deep source trenches 10 formed in a semiconductor body 12, which can be an epitaxially grown silicon body of one conductivity (e.g. N type) disposed over a silicon substrate 13 of the same conductivity. Termination region 58 includes a plurality of spaced termination trenches 14, and an EQR trench 16 spaced from trenches 14, which surround active region 56. Each trench 10 includes a thick oxide body 21 disposed in the interior and lining at least the bottom and a portion of the sidewalls thereof. Thick oxide 21 in EQR trench 16 reaches the top surface of body 12, while the thick oxide 21 in the termination trench 14 closest to active region 56 extends to the top surface of body 12 at one sidewall thereof, and only covers the opposing sidewall closest to the active region 56 partially, i.e. terminates below the top surface of body 12. Active region 56 further includes channel regions 62 of the opposite conductivity to body 12 (e.g. P type), and source regions 60 of the same conductivity as body 12 formed in channel regions 62. Note that one channel region 62 extends in termination region 58 of the device and does not include a source region 60 therein. Active region 56 further includes a plurality of insulated gate electrodes 38. Each gate electrode 38 is insulated from a respective channel region 62 by a gate oxide body 32, which is thinner than thick oxide body 21 disposed in trenches 10. Active region 56 further includes a plurality of deep source electrodes 24 which are insulated from, but extend through gate electrodes 38. Deep source electrodes 24 are ohmically coupled to a source contact 64, which is also ohmically coupled to source regions 60, and to channel regions 62 through a high conductivity contact region 54 of the same conductivity as channel regions 62.

According to one aspect of the present invention, termination trenches 14 are as deep as source trenches 10. Furthermore, termination region 58 includes a field relief electrode 26 preferably comprised of polysilicon, that includes a finger 27 residing in each termination trench 14, and a field plate portion 25 that extends away from active region 56 and over an insulation body 66 residing on body 12 between termination trenches 14 and EQR trench 16. Furthermore, an EQR electrode 28, which is preferably comprised of polysilicon, is disposed inside EQR trench 16. An EQR ring 50 is disposed over and ohmically coupled to EQR electrode 28 and may be extended and coupled to body 12 near the edge of the die (to the right of electrodes 28), whereby EQR trench 16 and the electrode contained therein serve to apply a constant drain voltage at the edge of the termination and block any surface leakage that may occur.

The device further includes a gate bus 40, preferably comprised of polysilicon, which is insulated from and disposed over field plate portion 25 of termination electrode 26. Gate bus 40 is electrically connected to gate electrodes 38. A metallic gate runner 52, which resides over bus 40 electrically couples bus 40 to a gate contact pad. The device further includes a drain contact 15, coupled to substrate 13.

Figure 2A:
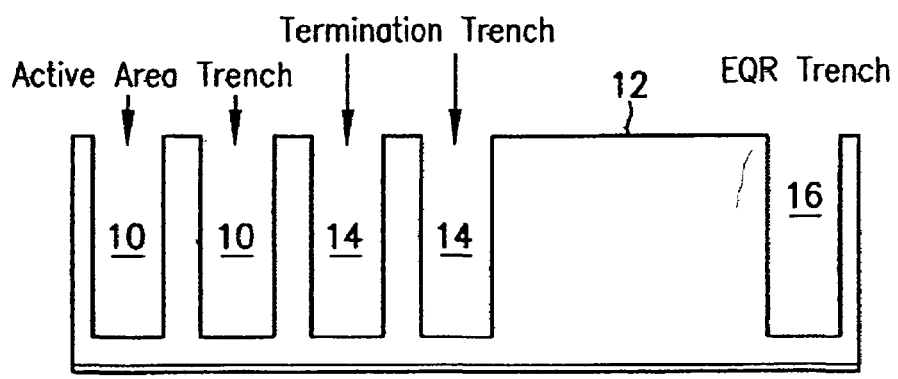
FIGS. 2A-2L illustrate selected steps in a process for fabrication of a device according to the present invention.

Referring now to FIG. 2A, to fabricate a device according to the present invention, a plurality of source trenches 10, termination trenches 14, and EQR trench 16 are formed in semiconductor body 12 using any known method. In one embodiment, trenches 10, 14, 16 may be 6 μm deep and 2 μm wide, and trenches 14, 16 may be spaced 1.2 μm from one another if trenches 10, 14, 16 are to be lined with a thick poly oxide. If oxide is to be grown (e.g. using thermal oxidation) on the sidewalls and bottom of trenches, trenches 10, 14, 16 may be 1.4 μm wide and trenches 10, 14 may be spaced 1.8 μm from one another.

Figure 2B:
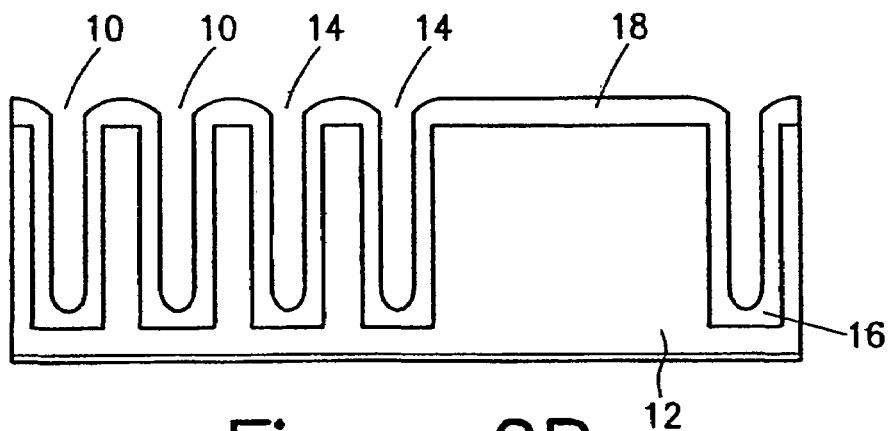
Figure 2C:
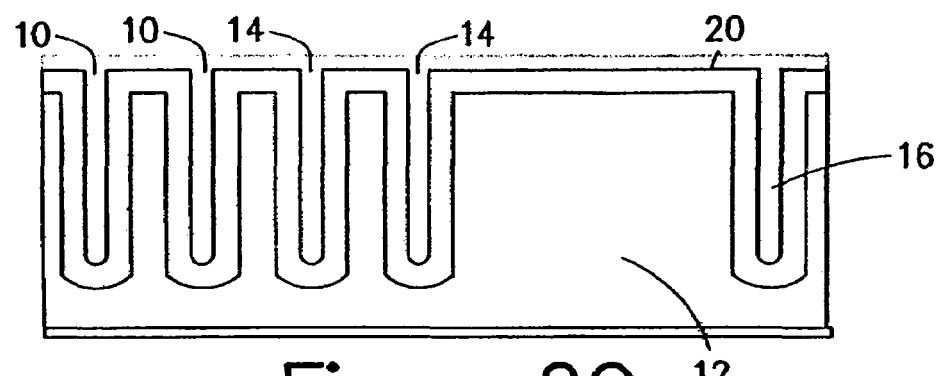

Referring next to FIG. 2B, in the next step thick oxide is formed on at least the sidewalls and the bottom of trenches 10, 14, 16. In a first method, pad oxide may be grown on the trench sidewalls and bottoms as well as other exposed surfaces of body 12, and then a thick (e.g. 4000 Å) polysilicon layer 18 may be deposited thereon. Thereafter, polysilicon layer 18 is oxidized to obtain a thick oxide layer 20 comprised of poly oxide on at least the sidewalls and the bottom of trenches 10, 14, 16. In an alternative method, pad oxide may be removed and the exposed surfaces can be oxidized in a wet oxidation step to obtain a thick oxide layer 20 over all exposed surfaces of body 12 including the sidewalls and the bottom of 10, 14, 16. FIG. 2C illustrates the result after a thick oxide layer 20 is formed using either method.

Figure 2D:
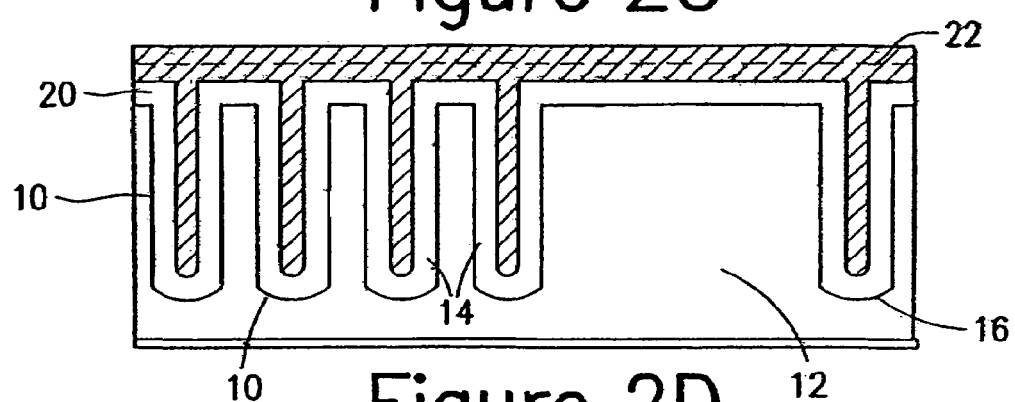
Figure 2E:
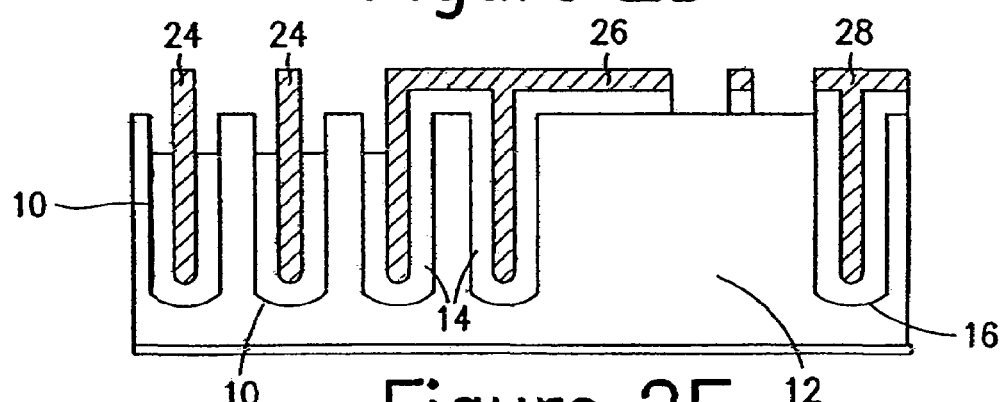
Figure 2F:
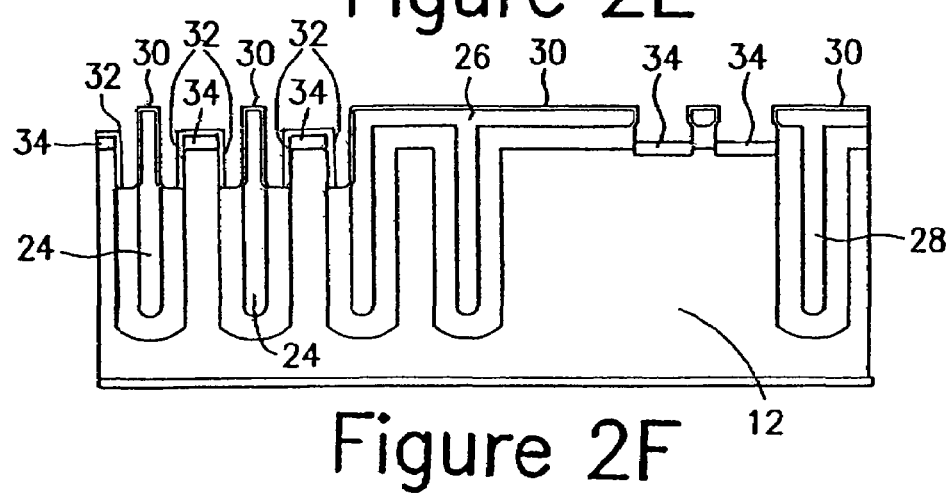

Referring next to FIG. 2D, polysilicon 22 is deposited to fill at least trenches 10, 14, 16. Note that polysilicon 22 may cover all open surfaces of the structure illustrated by FIG. 2C. Thereafter, polysilicon 22 is patterned using a mask and etch process to leave polysilicon source electrodes 24 in source trenches 10, field relief electrode 26, and EQR electrode 28 in EQR trench 16, as illustrated by FIG. 2E. Note that in this step a portion of thick oxide 22 on all sidewalls of trenches 10 is etched back inside trenches 10, and thick oxide 22 on only one sidewall of trench 14 (the sidewall closest to trenches 10) is etched back inside the trench.

Next, the exposed surfaces of electrodes 24, 26, 28 are oxidized leaving a thin oxide layer 30 thereon. Note that in this step the exposed surfaces of the sidewalls of trenches 10, and the sidewall of trench 14 are also oxidized to form gate oxide 32 thereon. Preferably, dopants to form a channel region are then implanted to form a channel implant region 34 before proceeding to the next step.

Figure 2G:
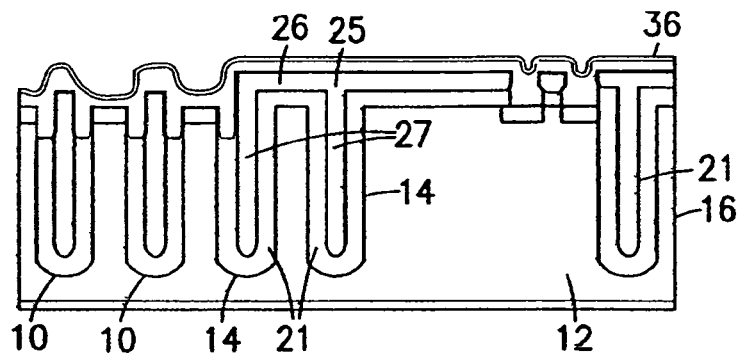
Figure 2H:
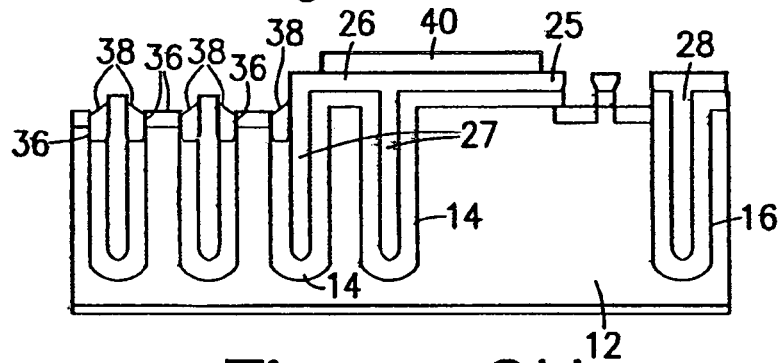
Figure 2I:
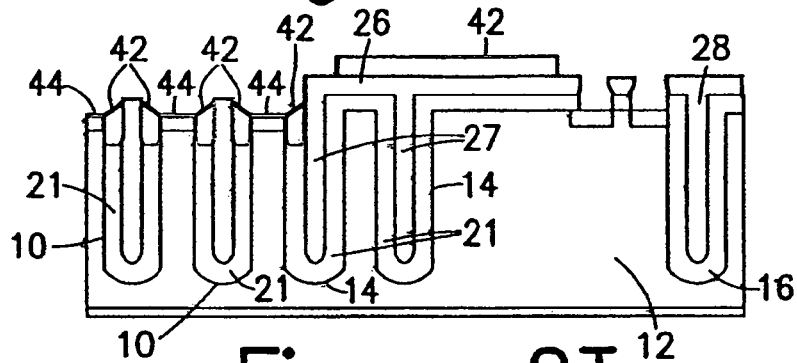
Figure 2J:
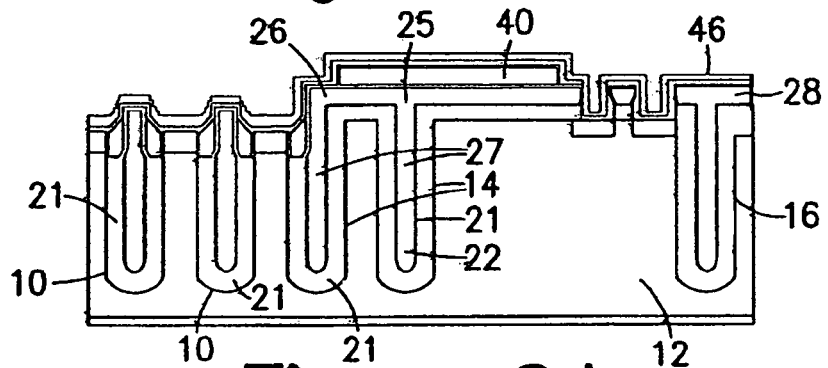
Figure 2K:
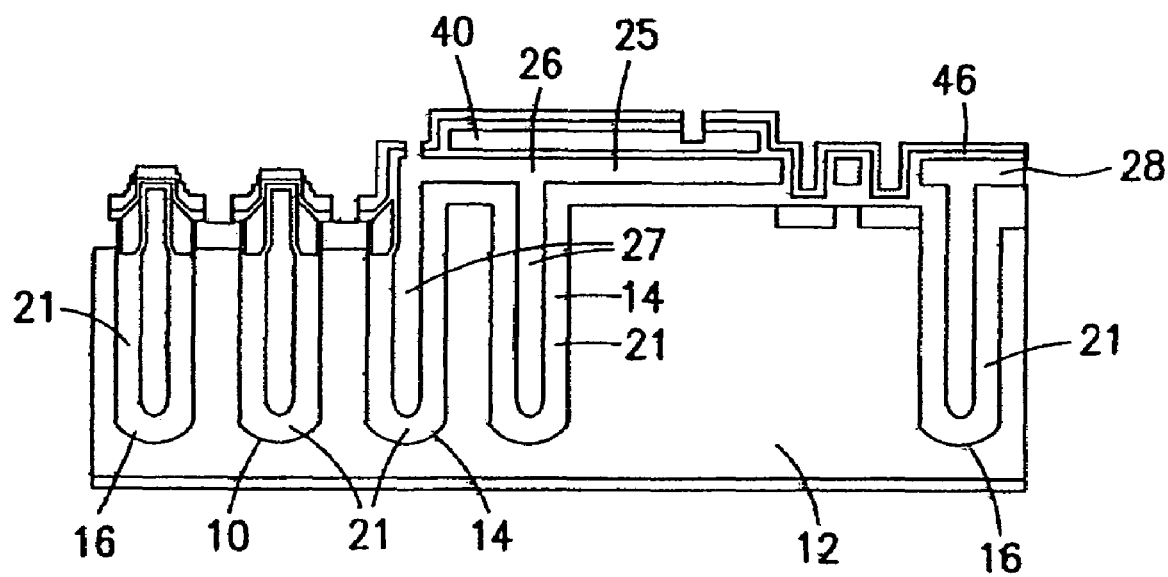
Figure 2L:
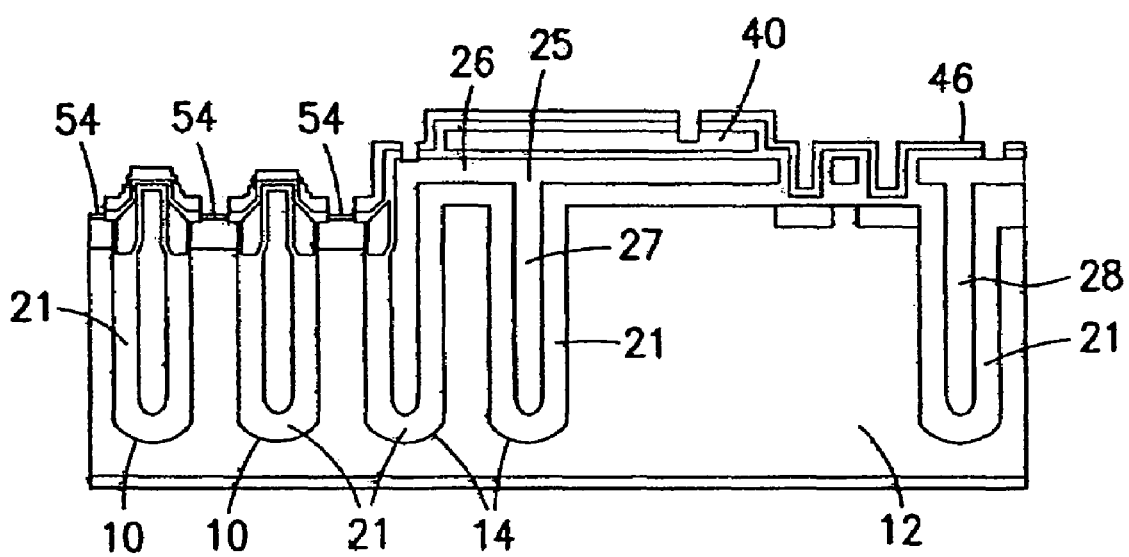

Referring next to FIG. 2G, polysilicon 36 is deposited and doped, and then etched to leave polysilicon gate electrodes 38 inside trenches 10, 14 adjacent gate oxide 32, and gate bus 40 as illustrated by FIG. 2H. Thereafter, in an oxidation step, the exposed surfaces of gate electrodes 38 and gate bus 40 are oxidized leaving oxide 42 thereon. A source mask is then applied and dopants for forming source regions are implanted through the mask openings into channel regions to form source implant regions 44. Next, a low density oxide body 46 (e.g. TEOS) is deposited on the arrangement shown by FIG. 2J, and patterned in appropriate mask etch steps to provide openings to body 12 and electrodes 24, 26 as illustrated by FIG. 2K. Note that in this step, source implant regions 44 are etched through to at least the channel region below. Note further that the openings so provided allow the source contact to make electrical contact to the source electrodes 24 in each active cell locally. Referring to FIG. 2L, in an alternative embodiment, electrodes 24 may make electrical contact with the source contact remotely (outside each active cell).

Thereafter, source implant region 44 is driven in a source drive, high conductivity contact regions 54 are implanted followed by an anneal, and optionally titanium is deposited and a thermal step is applied to obtain a silicide layer atop the exposed surfaces of body 12. Front metal is deposited and patterned to obtain source contact 48, EQR ring 50, and gate runner 52, and drain contact 15 is applied using any known method as illustrated by FIG. 1.

Note that in a device according to the present invention, channel region 62 that extends into termination region 58 includes a high conductivity region 54 to short source contact 64 the channel region. Note further that termination trench 14 closest to active region 56 also contains a non-functional insulated gate electrode at a sidewall that is closest to active region 56. The oxide thickness under field plate 25 is preferably the same as the thick oxide inside the trenches in order to support the full breakdown voltage between field plate 56 and semiconductor body 12 under the field plate.

In an alternative embodiment, it is possible to have more than two termination trenches, which would effectively extend the lateral width of field plate 25.

Figure 3:
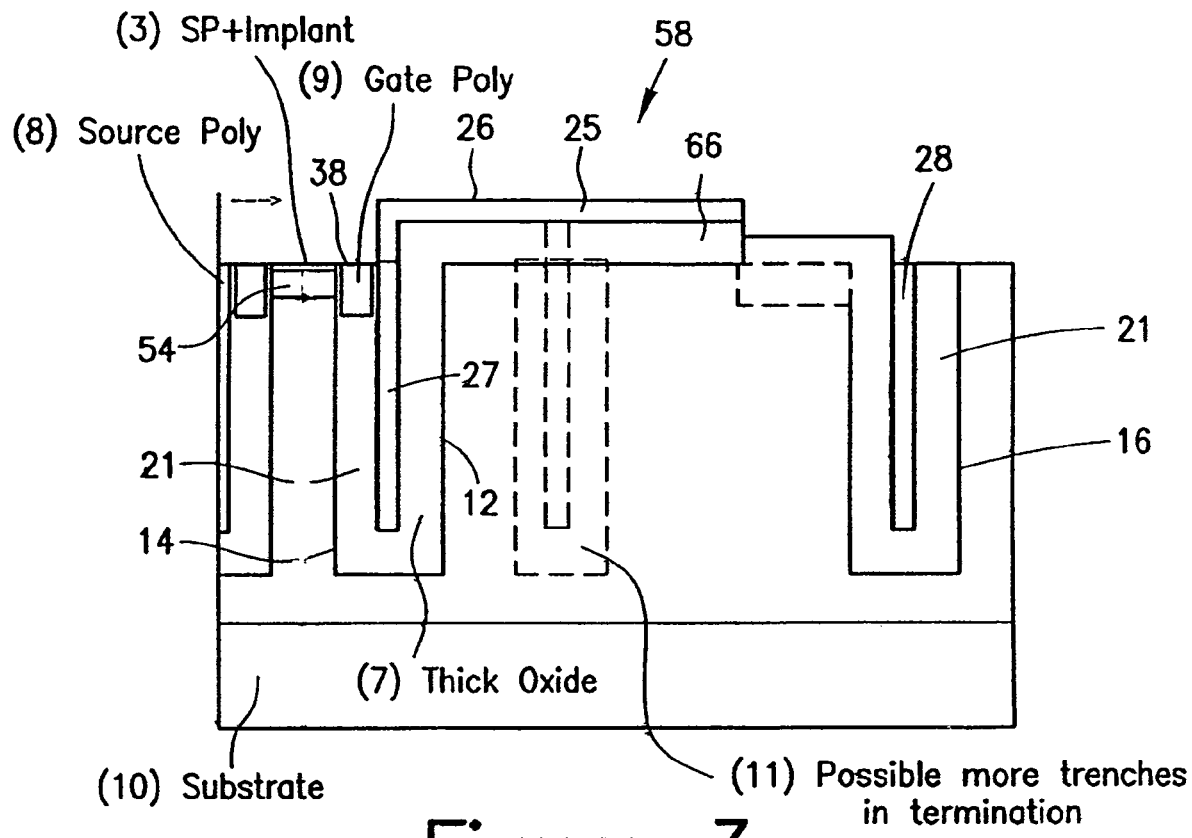
FIG. 3 illustrates another embodiment of the present invention.

Referring to FIG. 3, in which like numerals identify like features in a device according to a second embodiment, termination region 58 includes only one source trench 14, which is the same depth and width as source trenches 10.

Figure 4:
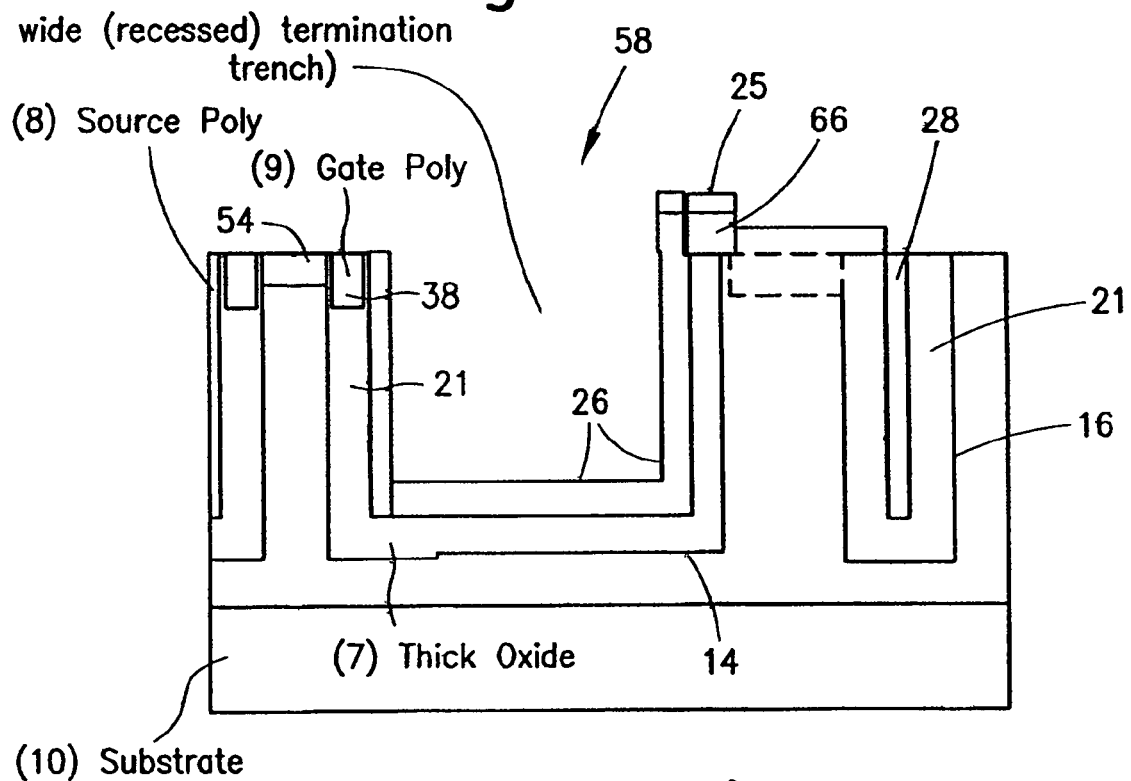
FIG. 4 illustrates yet another embodiment of the present invention.

Referring to FIG. 4, in which like numerals identify like features, in a device according to the third embodiment, termination trench 14, is the same depth but wider than source trenches 10.

In all embodiments, preferably, EQR trench 14 is the same depth and width as source trenches 10.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
   an active region, said active region including a plurality of source trenches extending into a semiconductor body of one conductivity, a source contact, and a source electrode insulated from said semiconductor body by a thick insulation layer disposed inside each said source trench and electrically connected to said source contact;
   a termination region adjacent said active region, said termination region including at least one termination trench which extends to the same depth as said source trenches, and a termination electrode disposed at least inside said termination trench; and
   another termination trench that extends to the same depth as said source trenches, wherein said termination electrode is disposed inside said another termination trench.

2. The device of claim 1, wherein said termination electrode includes a field plate extending away from said active region and disposed on a field insulation body over said semiconductor body.

3. The device of claim 1, wherein said termination region further includes an EQR trench that is the same depth as said source trenches, and an EQR electrode insulated from said semiconductor body disposed within said EQR trench.

4. The device of claim 3, wherein said EQR trench is the same width as said source trenches.

5. The device of claim 1, wherein said active region further includes a channel region of another conductivity, a first gate insulation adjacent a sidewall of one of said source trenches; a first gate electrode adjacent said first gate insulation and spanning said channel region adjacent said sidewall; a second gate insulation adjacent an opposing sidewall of said one of said source trenches; and a second gate electrode adjacent said second gate insulation and spanning said channel region adjacent said opposing sidewall, wherein a source electrode inside said one of said source trenches is adjacent but insulated from said first and second gate electrodes and extends to a depth below said gate electrodes.

6. The device of claim 5, wherein said gate insulations are thinner than said thick insulation layer inside said one of said source trenches.

* * * * *